(12) United States Patent
Inoue et al.

(10) Patent No.: US 9,748,303 B2
(45) Date of Patent: Aug. 29, 2017

(54) SOLID-STATE IMAGE PICK-UP APPARATUS, IMAGE PICK-UP SYSTEM, AND METHOD OF DRIVING SOLID-STATE IMAGE PICK-UP APPARATUS

(71) Applicant: CANON KABUSHIKI KAISHA, Tokyo (JP)

(72) Inventors: Daisuke Inoue, Ebina (JP); Yasuharu Ota, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 115 days.

(21) Appl. No.: 14/746,678

(22) Filed: Jun. 22, 2015

(65) Prior Publication Data
US 2015/0380449 A1 Dec. 31, 2015

(30) Foreign Application Priority Data
Jun. 25, 2014 (JP) .................................. 2014-130414

(51) Int. Cl.
*H04N 5/361* (2011.01)
*H01L 27/146* (2006.01)
*H04N 5/359* (2011.01)
*H04N 5/3745* (2011.01)

(52) U.S. Cl.
CPC ..... *H01L 27/14643* (2013.01); *H04N 5/3597* (2013.01); *H04N 5/361* (2013.01); *H04N 5/3745* (2013.01)

(58) Field of Classification Search
CPC ............ H01L 27/14643; H04N 5/3597; H04N 5/3745; H04N 5/361
See application file for complete search history.

(56) References Cited

U.S. PATENT DOCUMENTS

2002/0043610 A1* 4/2002 Lee ........................ H04N 3/155
250/208.1

FOREIGN PATENT DOCUMENTS

JP 2001-245216 A 9/2001

* cited by examiner

*Primary Examiner* — Tony Ko
(74) *Attorney, Agent, or Firm* — Canon USA, Inc. IP Division (57) ABSTRACT

A solid-state image pick-up apparatus of an example includes a photoelectric conversion portion, a transfer transistor configured to transfer a charge in the photoelectric conversion portion, and a signal output circuit configured to supply selectively a first voltage to turn on the transfer transistor and a second voltage to turn off the transfer transistor to the transfer transistor. The signal output circuit is configured to supply the second voltage having a voltage value selected from two or more different voltage values based on an output signal from a pixel.

20 Claims, 12 Drawing Sheets

SOLID-STATE IMAGE PICK-UP APPARATUS, IMAGE PICK-UP SYSTEM, AND METHOD OF DRIVING SOLID-STATE IMAGE PICK-UP APPARATUS

BACKGROUND

Field of the Disclosure

The present disclosure relates to a solid-state image pick-up apparatus, an image pick-up system, and a method of driving the solid-state image pick-up apparatus.

Description of the Related Art

Japanese Patent Application Laid-Open No. 2001-245216 discloses an image pick-up apparatus including a pixel which has a transfer transistor for transferring a signal accumulated in a photodiode to floating diffusion. There is disclosed a technology in which, in a configuration in which an ON level of a voltage applied to a gate electrode to conduct the transfer transistor is higher than an OFF level thereof, the OFF level of the voltage applied to the gate electrode of the transfer transistor is set to be lower than OFF levels of other transistors. With this, it is possible to suppress generation of a dark current component in the photodiode.

SUMMARY

A solid-state image pick-up apparatus of an example includes: a photoelectric conversion portion; a transfer transistor configured to transfer a charge in the photoelectric conversion portion; and a signal output circuit configured to supply selectively a first voltage to turn on the transfer transistor and a second voltage to turn off the transfer transistor to the transfer transistor. The signal output circuit is configured to supply the second voltage having a voltage value selected from two or more different voltage values based on an output signal from a pixel.

Further features of the present invention will become apparent from the following description of exemplary embodiments (with reference to the attached drawings).

DESCRIPTION OF THE EMBODIMENTS

According to some examples, by changing a second voltage, it is possible to reduce an image persistence phenomenon caused by imaging of high luminance light.

The inventors of the present invention found that, when an object having high luminance is imaged and then a relatively dark object is imaged, there is generated an image persistence phenomenon which is visually recognized like a stain in a part in which high luminance light has been imaged.

An object of some examples is to provide a solid-state image pick-up apparatus, an image pick-up system, and a method of driving the solid-state image pick-up apparatus, each of which can reduce the image persistence phenomenon generated when an object having high luminance is imaged and then a dark object is imaged.

Embodiment 1

Figure 1:
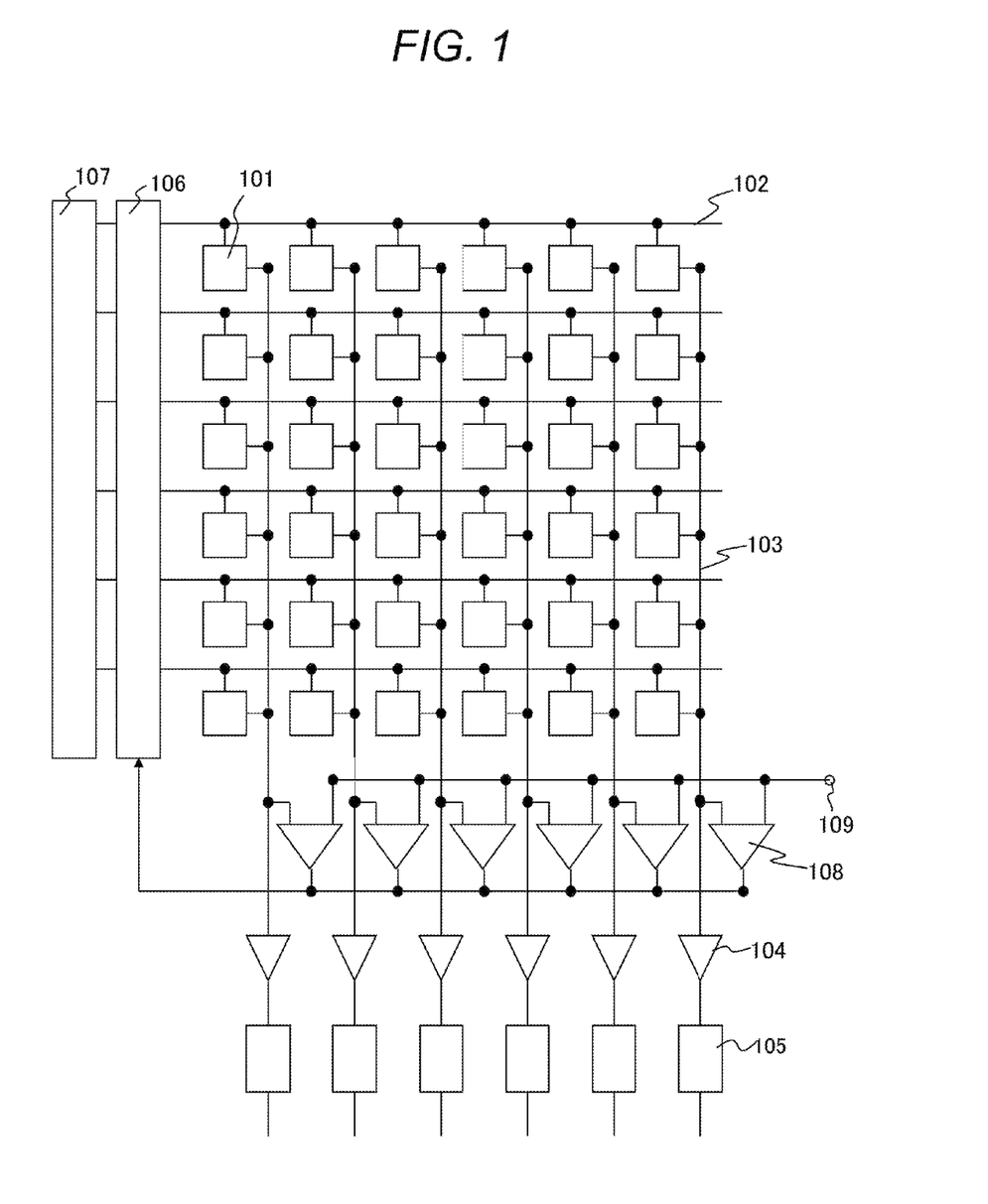
FIG. 1 is a diagram of a configuration example of a solid-state image pick-up apparatus according to Embodiment 1.

FIG. 1 is a diagram of a configuration example of a solid-state image pick-up apparatus according to Embodiment 1 of the present disclosure. The solid-state image pick-up apparatus is formed on the same substrate by a CMOS process or the like. A plurality of pixels 101 is arrayed in a matrix, and driving of the pixels 101 in each row is controlled by a transfer control line 102 or the like. A vertical scanning circuit 107 supplies a signal for performing scanning in a row direction to a signal output circuit 106. The signal output circuit 106 controls a signal of the transfer control line 102 or the like. The pixel 101 generates a signal by photoelectric conversion and outputs the signal to a column amplifier 104 via a pixel output reading line 103 in each column. The column amplifier 104 amplifies the signal. A noise reduction circuit 105 includes at least a part of a configuration for reducing noises of an output signal from the column amplifier 104.

Figure 2:
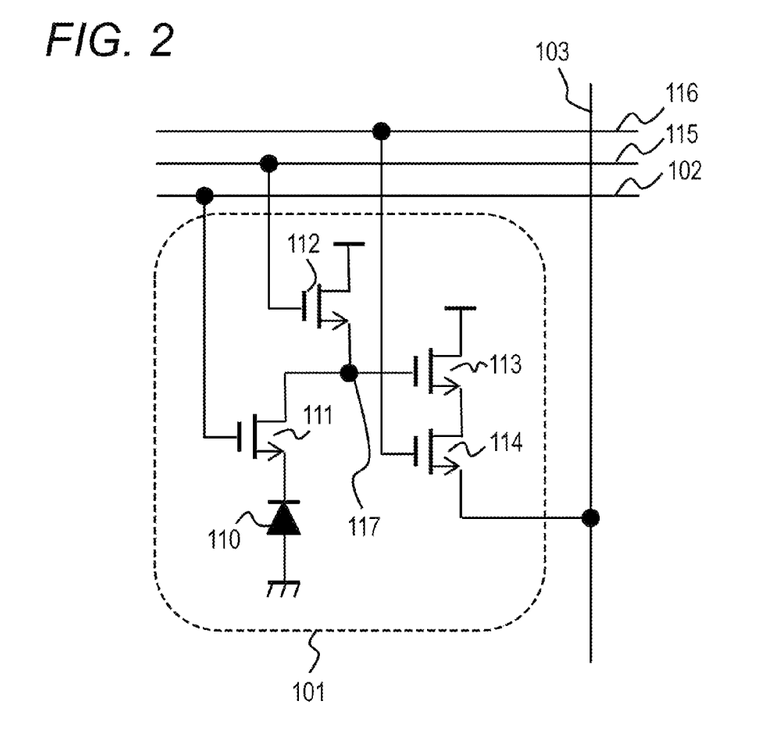
FIG. 2 is a circuit diagram of a configuration example of a pixel according to Embodiment 1.

FIG. 2 is a circuit diagram of a configuration example of the pixel 101 in FIG. 1. The pixel 101 includes a photodiode 110, a transfer transistor 111, a reset transistor 112, an amplification transistor 113, and a selection transistor 114. The transfer control line 102 is connected to a gate electrode of the transfer transistor 111, a reset control line 115 is connected to a gate electrode of the reset transistor 112, and a selection control line 116 is connected to a gate electrode of the selection transistor 114. The photodiode 110 is a photoelectric conversion portion for converting light into a charge. In a case where a gate voltage of the transfer transistor 111 is a low level, the transfer transistor 111 is turned off and charges are accumulated in the photodiode 110. When the gate voltage of the transfer transistor 111 becomes a high level, the transfer transistor 111 is turned on and the transfer transistor 111 transfers the charges in the photodiode 110 to floating diffusion 117. The transferred charges are converted into a voltage in the floating diffusion 117. When the selection transistor 114 is turned on, the amplification transistor 113 outputs a voltage corresponding to the voltage of the floating diffusion 117 to the pixel output reading line 103.

The inventors of the present invention confirmed by an experiment that the image persistence phenomenon could be reduced by setting, to a high level, an OFF level VTXL (set to, for example, −1.4 V) of a voltage applied to the gate electrode of the transfer transistor 111 set to suppress generation of a dark current in the photodiode 110. For example, by setting the OFF level VTXL=0 V, it is possible to reduce the image persistence phenomenon.

Figure 13A:
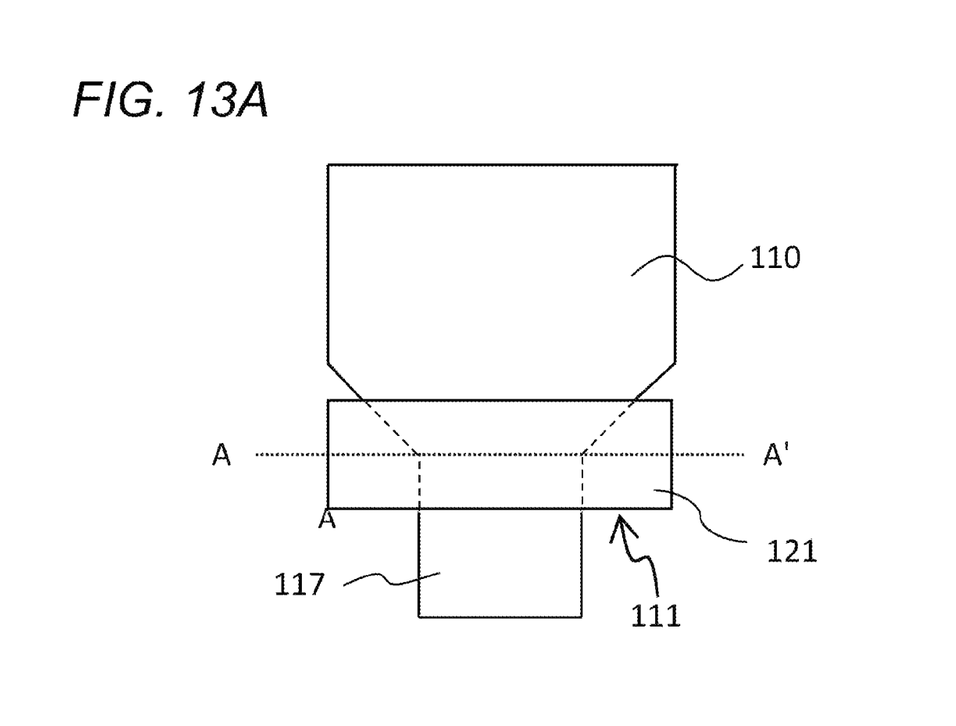
FIGS. 13A and 13B are diagrams for describing an image persistence phenomenon.
Figure 13B:
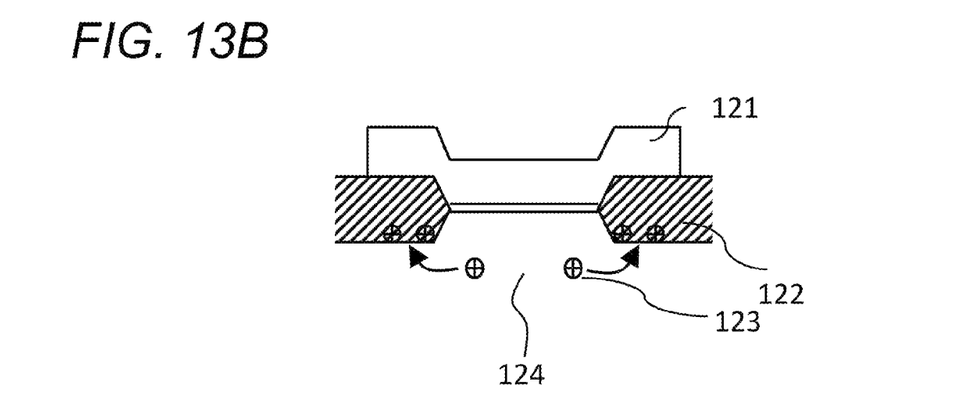

From this, the image persistence phenomenon is presumed as follows. FIG. 13A is a plan view of the pixel 101 formed on a semiconductor substrate, which includes the photodiode 110, the transfer transistor 111, and the floating diffusion 117. FIG. 13B is a cross-sectional view of a region indicated by a dotted line A-A' in FIG. 13A. A gate electrode 121 is provided to cover a channel region between the photodiode 110 and the floating diffusion 117. The region from the photodiode 110 to the floating diffusion 117 may be formed as a continuous semiconductor region. Herein, the gate electrode 121 is also provided on a LOCOS 122 formed on each side of the channel region in the A-A' cross-section. In a case where the photodiode 110 is irradiated with high luminance light in a state in which a voltage having the OFF level VTXL=−1.4 V is applied to the gate electrode 121, electrons and holes are excessively generated. The electrons are attracted to an electric potential of a well 124 of the photodiode 110. Holes 123 are attracted to the OFF level VTXL=−1.4 V, and a part thereof is trapped by a LOCOS edge below the transfer transistor 111. It is considered that the trapped holes ease an electric field of the OFF level VTXL and a dark current is generated below the transfer transistor 111. The dark current depends on high luminance light, and therefore, in a case where a pixel signal level of the photodiode 110 is large, incident of high luminance light can be decided.

In FIG. 1, a decision unit 108 operates as a comparator and compares a pixel signal outputted to the pixel output reading line 103 with a reference voltage of a reference voltage line 109. Note that the decision unit 108 may use a clipping circuit which does not cause a voltage of the pixel output reading line 103 to be equal to or larger than a predetermined voltage. Assuming that the reference voltage supplied to the reference voltage line 109 as a V clipping voltage, when the voltage exceeds the V clipping voltage, the clipping circuit is operated and a current value is changed. Therefore, the decision unit 108 may make decision by detecting a change in the current value based on whether or not the clipping circuit is operated.

Herein, an example where the photodiode 110 generates electrons will be described. In a case where a signal of the pixel output reading line 103 is lower than the reference voltage, the decision unit 108 outputs a high level signal as a high luminance signal, whereas, in a case where the signal of the pixel output reading line 103 is higher than the reference voltage, the decision unit 108 outputs a low level signal as a low luminance signal. The decision unit 108 outputs the above decision result signal to the signal output circuit 106. For example, the reference voltage of the reference voltage line 109 is a voltage of a pixel signal in which high luminance light is incident on the photodiode 110 to saturate the photodiode 110.

Figure 3:
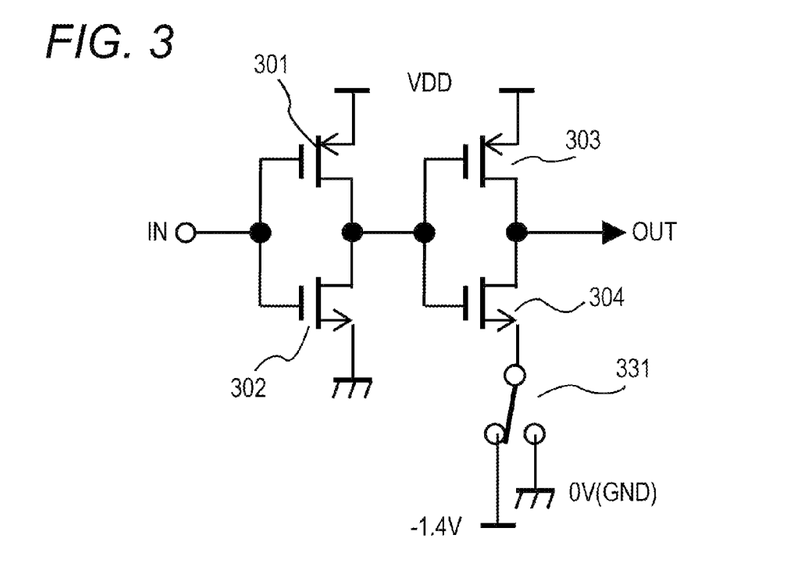
FIG. 3 is a circuit diagram of a configuration example of a signal output circuit according to Embodiment 1.

FIG. 3 is a circuit diagram of a configuration example of the signal output circuit 106 in FIG. 1. The signal output circuit 106 includes a buffer circuit including CMOS inverters 301 and 302 and CMOS inverters 303 and 304. The signal output circuit 106 can switch the voltage VTXL which is a low level to −1.4 V or 0 V with the use of a switch 331 and output the voltage VTXL to the transfer control line 102. A high level voltage of the transfer control line 102 is usually a power supply voltage VDD, and a low level voltage is VTXL=−1.4 V. Note that, in a case where the decision result signal outputted from the decision unit 108 is a high level signal, the signal output circuit 106 sets the low level voltage VTXL=0 V and outputs a transfer control signal to the transfer control line 102. Meanwhile, in a case where the decision result signal is a low level signal, the signal output circuit 106 sets the low level voltage VTXL=−1.4 V and supplies a transfer control signal to the transfer control line 102.

Figure 4:
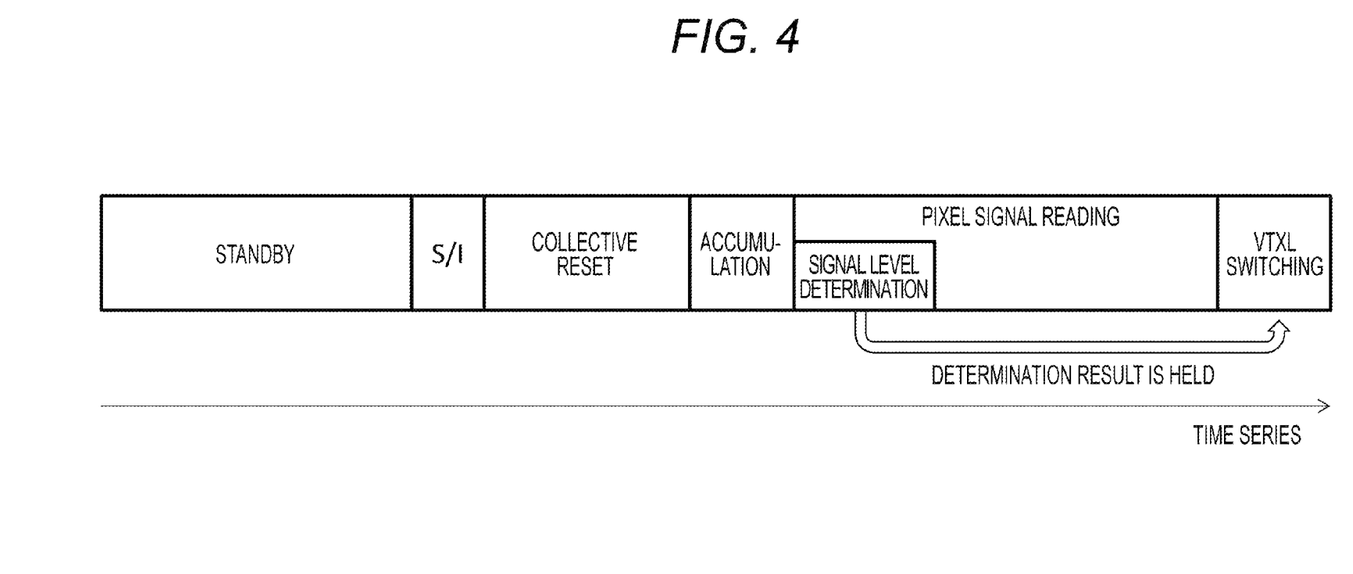
FIG. 4 is a driving sequence diagram according to Embodiment 1.

FIG. 4 is a timing chart showing in time series a method of driving the solid-state image pick-up apparatus in a case where image pick-up of a frame is performed. Immediately after power is supplied, the solid-state image pick-up apparatus is in a standby state, and operation is started by performing serial interface (S/I) communication of operation setting of the solid-state image pick-up apparatus (CMOS image sensor IC). Next, the transfer transistors 111 and the reset transistors 112 are turned on, and the photodiodes 110 are collectively reset. Next, the transfer transistors 111 and the reset transistors 112 are turned off, and the photodiodes 110 start charge accumulation operation. Next, the transfer transistors 111 are turned on and charges of the photodiodes 110 are transferred to the floating diffusion 117, and the charge accumulation is terminated. Next, the pixels 101 output pixel output signals to the pixel output reading lines 103 in accordance with the charges of the floating diffusion 117 (pixel signal reading). The decision unit 108 decides whether or not the pixel signals of the pixel output reading lines 103 are high luminance signals, outputs high level signals in a case where the pixel signals are high luminance signals and outputs low level signals in a case where the pixel signals are a low luminance signal (signal level decision). In a case where the decision unit 108 outputs high level signals, the signal output circuit 106 holds the output signals from the decision unit 108 until the pixel signal reading is terminated and switches the low level voltage VTXL from −1.4 V to 0 V when the pixel signal reading is terminated. With this, in a next frame and frames after the next frame, image pick-up is performed at the switched low level voltage VTXL=0 V.

The signal output circuit 106 supply selectively a first voltage (high level voltage) VDD to turn on the transfer transistor 111 and a second voltage (low level voltage) VTXL to turn off the transfer transistor 111 to the gate electrode of the transfer transistor 111. The signal output circuit 106 supplies one of two or more values as the second voltage VTXL based on the output signal from the pixel 101.

Specifically, in a case where luminance of an output signal from the pixel 101 is smaller than a threshold (reference voltage), the signal output circuit 106 supplies the second voltage VTXL=−1.4 V having a first voltage value (e.g., −1.4 V). Meanwhile, in a case where luminance of the output signal from the pixel 101 is larger than the threshold (reference voltage), the signal output circuit 106 supplies the second voltage VTXL=0 V having a second voltage value (e.g., 0 V). The second voltage value is a voltage value between a voltage value of the first voltage VDD and the first voltage value.

The plurality of pixels 101 is provided in a matrix. The signal output circuit 106 supplies the common first voltage VDD or second voltage VTXL to the transfer transistors 111 of the pixels 101 in the same row. In a case where an output signal from the pixel 101 whose luminance is larger than the threshold does not exist among output signals from the pixels 101 in a frame, the signal output circuit 106 supplies a first one of the second voltage VTXL=−1.4 V to the pixels 101 in all rows in a frame subsequent to the frame. Meanwhile, in a case where the output signal from the pixel 101 whose luminance is larger than the threshold exists among the output signals from the pixels 101 in the frame, the signal output circuit 106 supplies a second one of the second voltage VTXL=0 V to the pixels 101 in the all rows in the frame subsequent to the frame.

Figure 5:
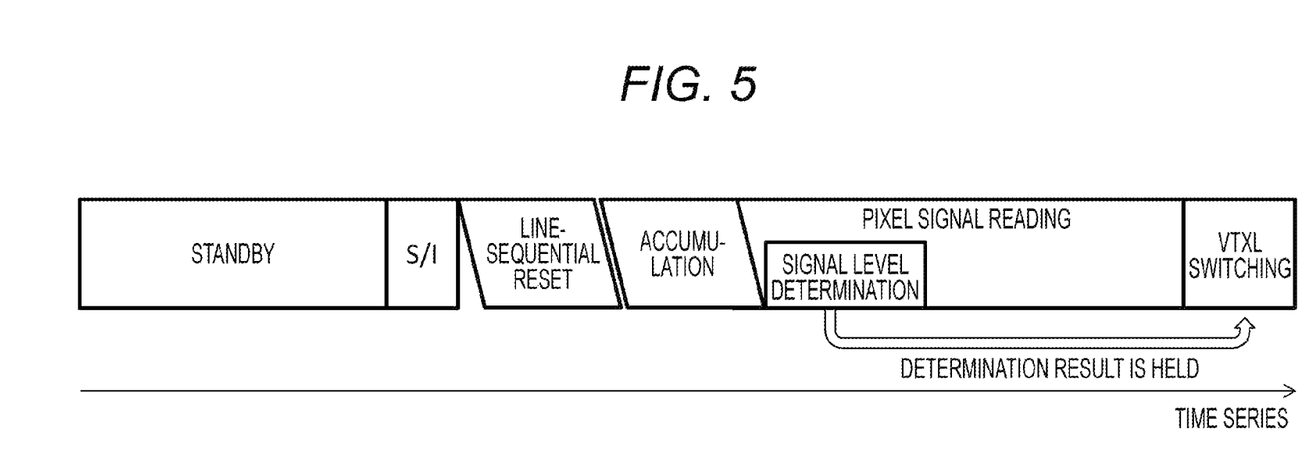
FIG. 5 is a rolling driving sequence diagram.

FIG. 5 is a diagram of a sequence of rolling driving when image pick-up of a moving image is performed in the solid-state image pick-up apparatus. In a case where image pick-up of a still image is performed in FIG. 4, all the pixels 101 are collectively reset, whereas, in a case where image pick-up of a moving image is performed, reading is performed by line-sequentially resetting the rows of the pixels 101 and line-sequentially performing charge accumulation. Note that the image pick-up of the moving image in FIG. 5 and the image pick-up of the still image in FIG. 4 are the same in terms of points in which the output signals from the decision unit 108 are held until the pixel signal reading is terminated and the low level voltage VTXL is switched when the pixel signal reading is terminated.

As described above, luminance of signals in a first frame is detected, and in a case where the luminance has a level at which image persistence could occur, the low level voltage VTXL is switched from −1.4 V to 0 V, and therefore it is possible to reduce image persistence in image pick-up in a next frame and frames after the next frame.

Note that, although an example where the solid-state image pick-up apparatus of this embodiment is the CMOS image sensor has been described, the solid-state image pick-up apparatus can be also applied to a CCD by binarizing a low level of a voltage applied to a MOS capacitor electrode.

Embodiment 2

Figure 6:
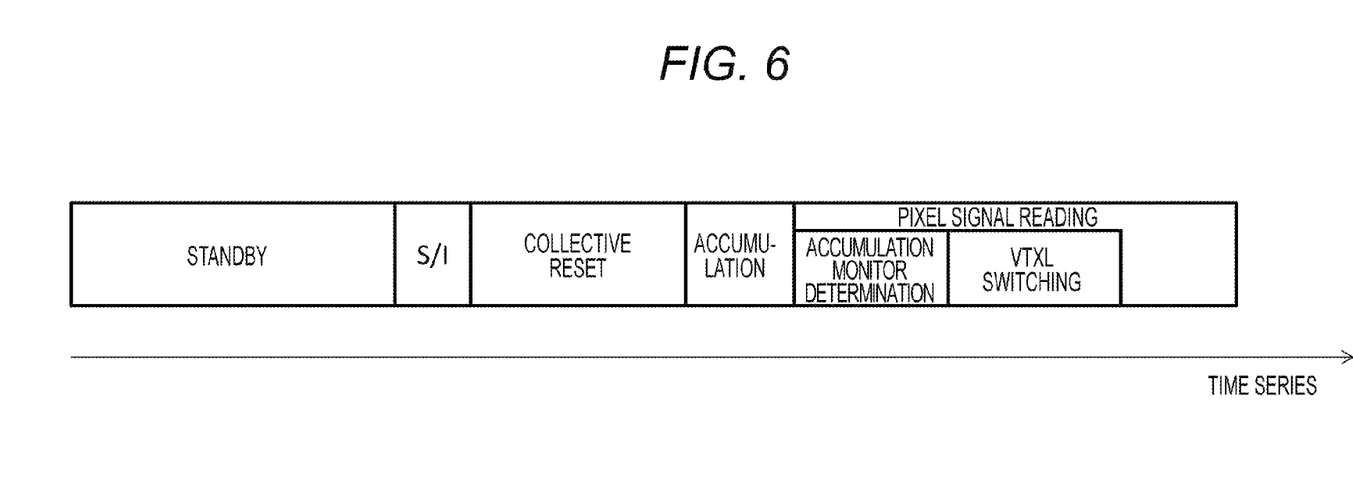
FIG. 6 is a driving sequence diagram according to Embodiment 2.

FIG. 6 is a sequence diagram of a method of driving a solid-state image pick-up apparatus according to Embodiment 2 of the present disclosure. This embodiment is similar to Embodiment 1 from the standby state to the signal level decision. However, this embodiment is different from Embodiment 1 in that an output signal from a decision result of the decision unit 108 is immediately fed back to switching of the low level voltage VTXL of the signal output circuit 106. The signal output circuit 106 immediately switches the low level voltage VTXL in a row driven after a row decided by the decision unit 108. With this, by reducing a period in which driving is performed at VTXL=−1.4 V which is a condition which increases damage to the pixels 101 in the following rows, it is possible to reduce image persistence damage, as compared with Embodiment 1.

As described above, the plurality of pixels 101 is provided in a matrix. The signal output circuit 106 supplies the common first the voltage (high level voltage) VDD and second voltage (low level voltage) VTXL to the transfer transistors 111 of the pixels 101 in the same row. In a case where an output signal from the pixel 101 whose luminance is larger than the threshold (reference voltage) does not exist among output signals from the pixels 101 in a row (current row), the signal output circuit 106 supplies the first one of the second voltage VTXL=−1.4 V when another row (next row) adjacent to the row is selected. Meanwhile, in a case where the output signal from the pixel 101 whose luminance is larger than the threshold (reference voltage) exists among the output signals from the pixels 101 in the row, the signal output circuit 106 supplies the second one of the second voltage VTXL=0 V when the another row is selected.

Embodiment 3

Figure 7:
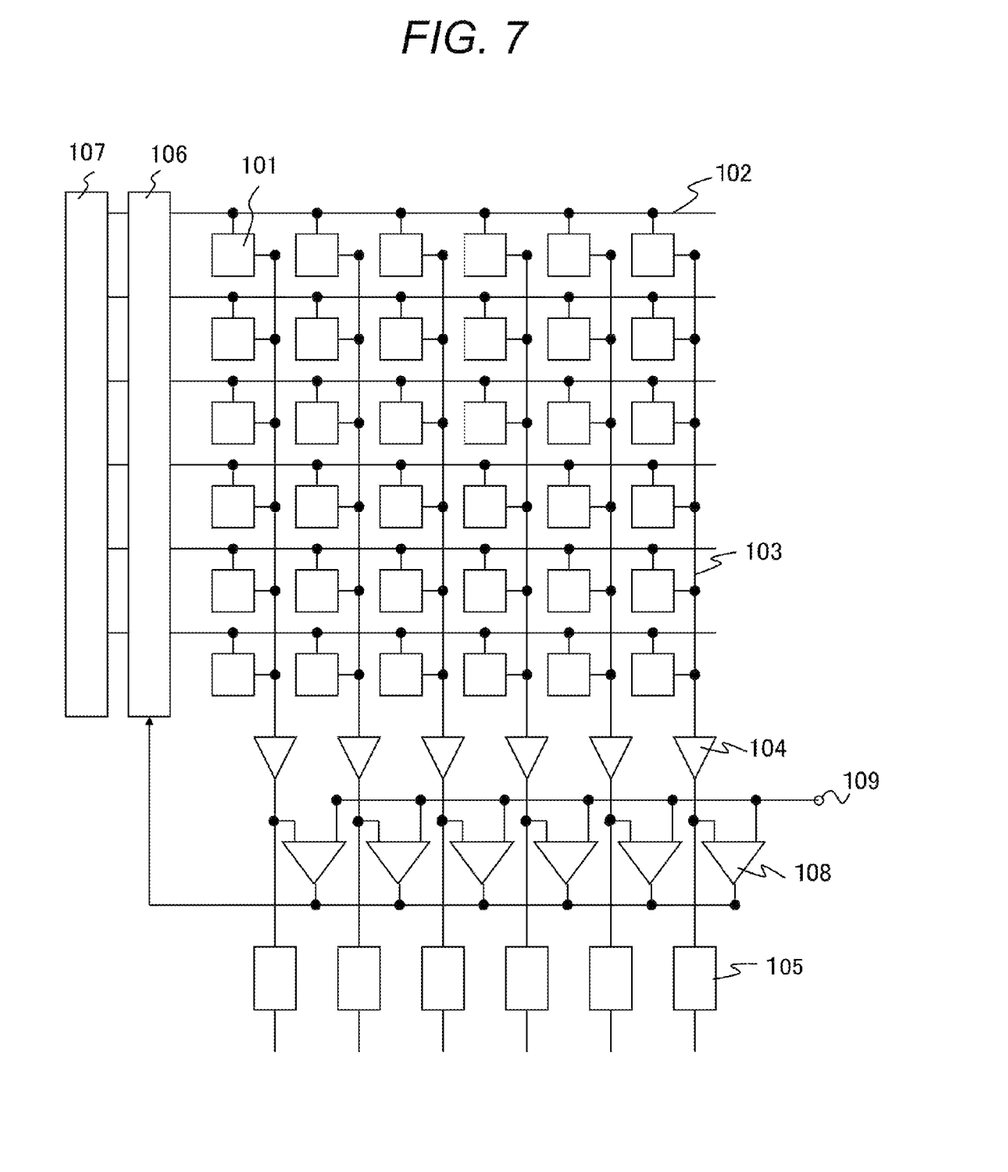
FIG. 7 is a diagram of a configuration example of a solid-state image pick-up apparatus according to Embodiment 3.

FIG. 7 is a configuration example of a solid-state image pick-up apparatus according to Embodiment 3 of the present disclosure. This embodiment (FIG. 7) is different from Embodiment 1 (FIG. 1) in that the decision unit 108 is inserted after the column amplifier 104. Operation of other components of this embodiment is same as that of Embodiment 1. Hereinafter, a difference between this embodiment and Embodiment 1 will be described. The decision unit 108 in each column compares an output signal from the column amplifier 104 with the reference voltage of the reference voltage line 109 and outputs a high level signal in a case where the output signal from the column amplifier 104 is a high luminance signal in the same way as Embodiment 1. Meanwhile, in a case where the output signal from the column amplifier 104 is a low luminance signal, the decision unit 108 in each column outputs a low level signal. In this embodiment, the column amplifier 104 amplifies a pixel signal of the pixel output reading line 103, and therefore the decision unit 108 can perform accurate decision. Note that the reference voltage to be compared with the amplified pixel signal is supplied to the reference voltage line 109. A method of driving the solid-state image pick-up apparatus of this embodiment is the same as that of Embodiment 1. As described above, even in a case where an insertion position of the decision unit 108 is changed, this embodiment, as well as Embodiment 1, can reduce image persistence.

Embodiment 4

Figure 8:
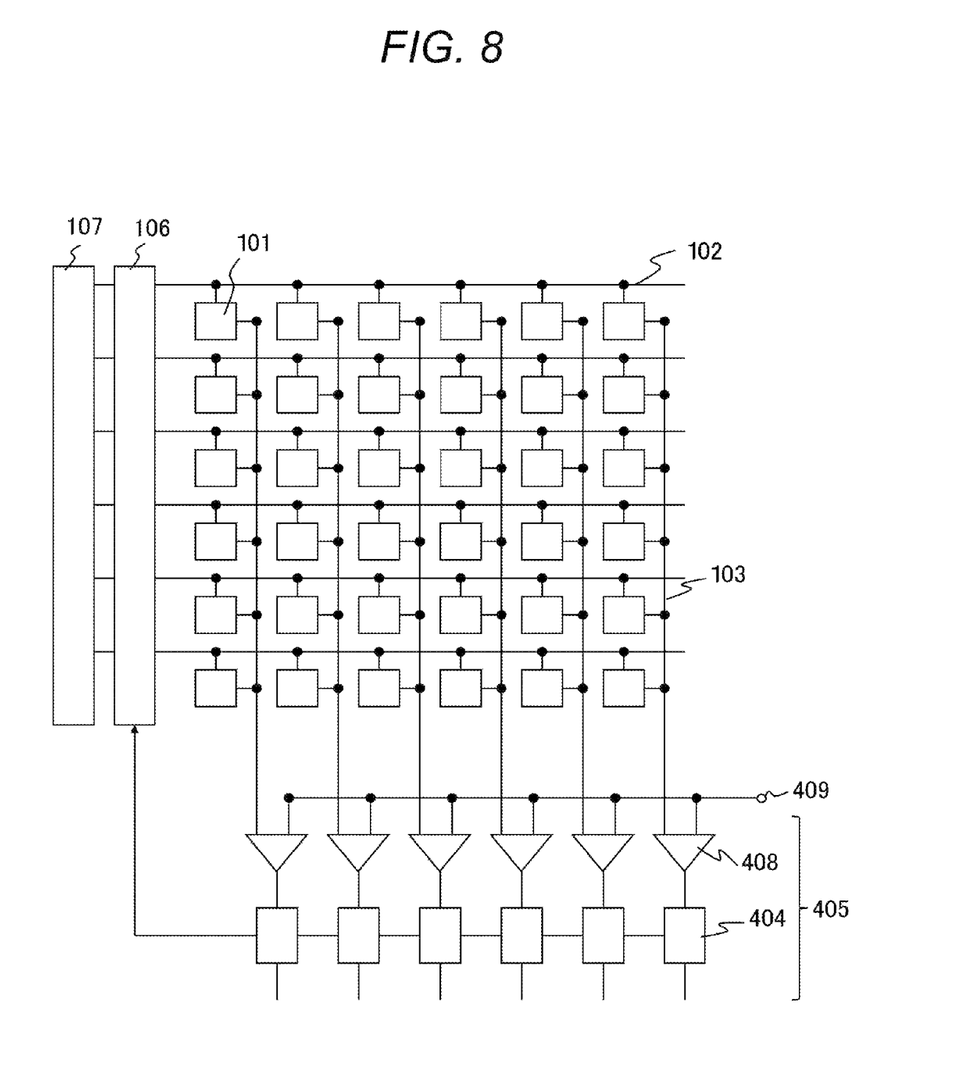
FIG. 8 is a diagram of a configuration example of a solid-state image pick-up apparatus according to Embodiment 4.

FIG. 8 is a diagram of a configuration example of a solid-state image pick-up apparatus according to Embodiment 4 of the present disclosure. In this embodiment (FIG. 8), a column AD converter 405 is provided in each column instead of the column amplifier 104, the noise reduction circuit 105, and the decision unit 108 of Embodiment 1 (FIG. 1). The column AD converter 405 includes a comparator 408 and a counter latch 404. Hereinafter, a difference between this embodiment and Embodiment 1 will be described.

The pixel 101 outputs a pixel signal, which is an analog signal, to the pixel output reading line 103. The column AD converter 405 converts the analog signal of the pixel output reading line 103 into a digital signal. A reference signal whose level is changed with time is supplied to a reference voltage line 409. The reference signal is, for example, a lamp signal whose level becomes large with time. The comparator 408 compares the pixel signal of the pixel output reading line 103 with the reference signal of the reference voltage line 409, and when magnitudes of both the signals are reversed, the comparator 408 inverts an output signal. The counter latch 404 starts counting when a change in the level of the reference signal is started, terminates the counting when the comparator 408 inverts the output signal, and outputs a count value. The count value is a pixel signal which is a digital signal.

The comparator 408, as well as the decision unit 108 of Embodiment 1, is also a decision unit that decides whether the pixel signal of the pixel output reading line 103 is a high luminance signal or a low luminance signal. The reference signal and a comparison reference voltage are supplied to the reference voltage line 409. The comparator 408 compares the comparison reference voltage of the reference voltage line 409 with the pixel signal of the pixel output reading line 103. The comparator 408 outputs a high level signal in a case where the pixel signal of the pixel output reading line 103 is a high luminance signal and outputs a low level signal in a case where the pixel signal of the pixel output reading line 103 is a low luminance signal. The counter latch 404 stores an output signal from a decision result of the comparator 408 and outputs the signal of the decision result to the signal output circuit 106. The signal output circuit 106 performs switching processing of the low level voltage VTXL in the same way as Embodiment 1.

As described above, this embodiment can remove the decision unit 108 by using the comparator 408 instead of the decision unit 108 of Embodiment 1.

Embodiment 5

Figure 9:
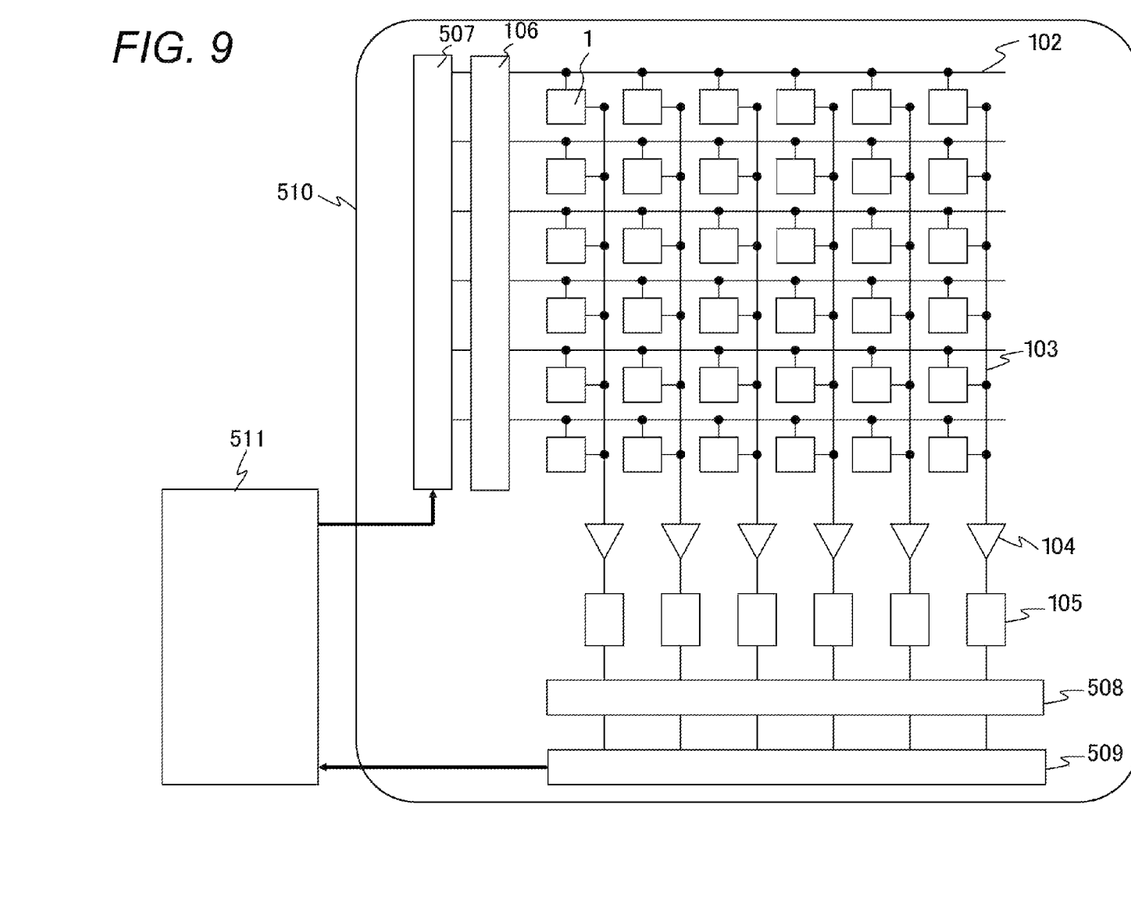
FIG. 9 is a diagram of a configuration example of a solid-state image pick-up apparatus according to Embodiment 5.

FIG. 9 is a configuration example of a solid-state image pick-up apparatus and an image processing apparatus according to Embodiment 5 of the present disclosure. A CMOS image sensor IC 510 is a solid-state image pick-up apparatus, and an image processing IC 511 is an image processing apparatus. The CMOS image sensor IC 510 and the image processing IC 511 are different IC chips formed on different substrates. The CMOS image sensor IC 510 is an IC in which a vertical decoder circuit 507 is provided instead of the vertical scanning circuit 107 of the solid-state image pick-up apparatus in FIG. 1. Pixel signals whose noises have been reduced by the noise reduction circuit 105 are held by a signal accumulation portion 508 and are sequentially read and outputted by a horizontal scanning circuit 509. Hereinafter, a difference between this embodiment and Embodiment 1 will be described. The image processing IC 511 performs image processing on an image signal inputted from the image sensor IC 510 and outputs a control signal to the vertical decoder circuit 507. The vertical decoder circuit 507 can select an arbitrary pixel row.

Figure 10:
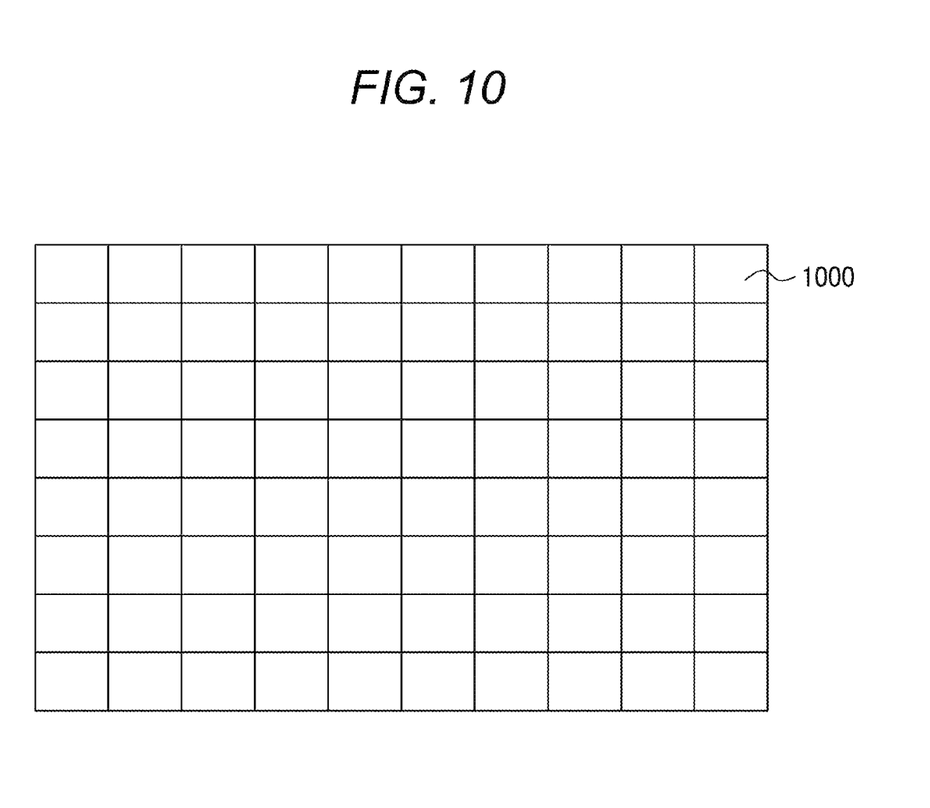
FIG. 10 is a diagram of a region block division image in a frame.

FIG. 10 is a diagram of an image in a frame. As depicted in FIG. 10, the image processing IC 511 divides, for example, the image into region blocks 1000 of 8×10 and acquires an average value of pixel signals in each region block 1000 to hold the average value. The image processing IC 511 includes a decision unit and decides, based on the average value of each region block 1000, whether or not a signal has such high luminance that causes image persistence in the CMOS image sensor IC 510 in the same way as Embodiment 1. The image processing IC 511 can detect an address of the pixel 101 that generates a high luminance signal in each region block 1000. As to a row in which the high luminance signal is detected, the image processing IC 511 outputs, as a result of the decision, a command indicating address of the row in which the high luminance signal is detected to the vertical decoder circuit 507. The vertical decoder circuit 507 outputs a high level signal which is the decision result to the signal output circuit 106 at the address of the pixel 101 of the high luminance signal and outputs a low level signal which is the decision result to the signal output circuit 106 at an address of the pixel 101 of the low luminance signal. The signal output circuit 106 performs switching processing on the low level voltage VTXL based on the signals of the decision result of the vertical decoder circuit 507 in the same way as Embodiment 1.

For example, in a case where an average value of output signals from the region block 1000 whose luminance is larger than the threshold does not exist among average values of output signals from the region blocks 1000 in a current frame, the signal output circuit 106 supplies the first one of the second voltage VTXL=−1.4 V in all the pixels in a next frame. Meanwhile, in a case where an average value of output signals from the region blocks 1000 whose luminance is larger than the threshold exists among the average values of the output signals from the region block 1000 in the current frame, the signal output circuit 106 supplies the second one of the second voltage VTXL=0 V in all the pixels in the next frame.

As described above, the decision unit is provided in the image processing IC 511 of this embodiment and as well as Embodiment 1, can reduce an image persistence damage. The image processing IC 511 advantageously has high flexibility in setting of a decision condition of a high luminance signal and the region blocks 1000.

Embodiment 6

Figure 11:
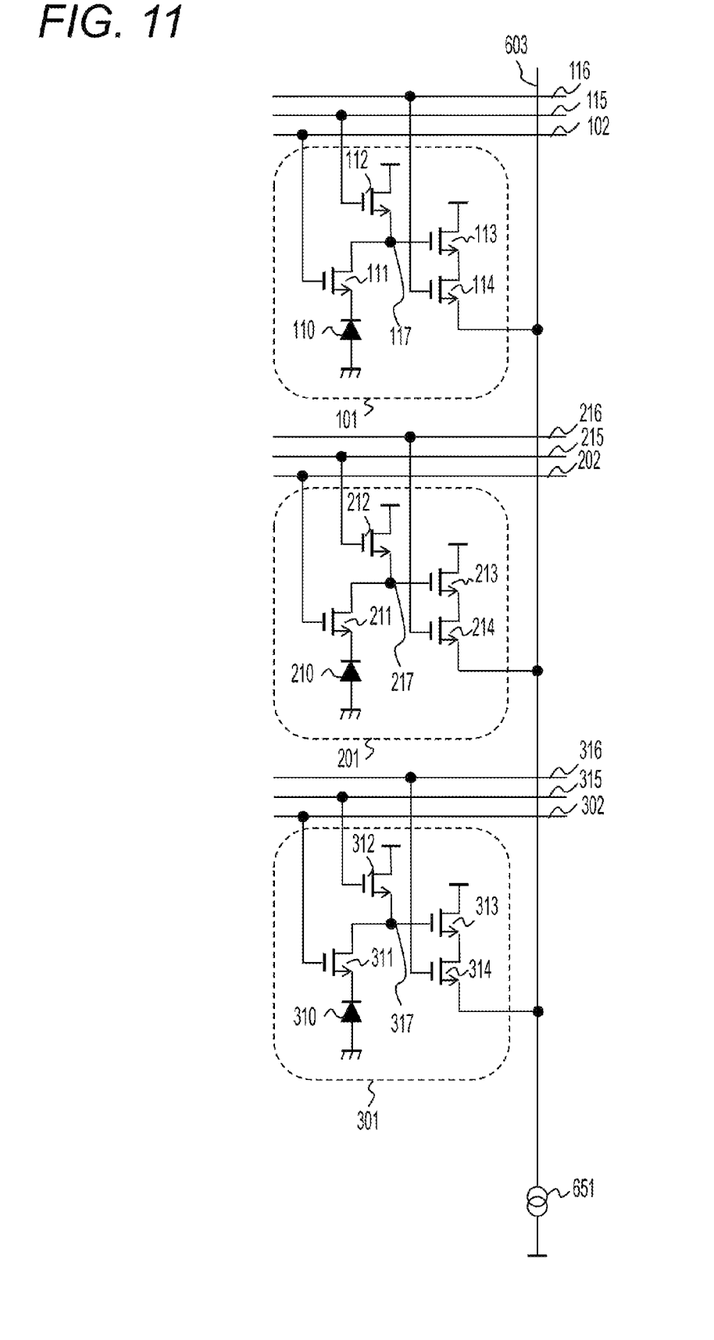
FIG. 11 is a circuit diagram of a configuration example of a pixel according to Embodiment 6.

FIG. 11 is a circuit diagram of a configuration example of a pixel according to Embodiment 6 of the present disclosure. Hereinafter, a difference between this embodiment and Embodiment 1 will be described. The pixel 101 and pixels 201 and 301 are pixels in three rows among the plurality of pixels 101 in a matrix in FIG. 1. The pixel 101 includes the photodiode 110, the transfer transistor 111, the reset transistor 112, the amplification transistor 113, the selection transistor 114, and the floating diffusion 117. The pixel 201 includes a photodiode 210, a transfer transistor 211, a reset transistor 212, an amplification transistor 213, a selection transistor 214, and floating diffusion 217. The pixel 301 includes a photodiode 310, a transfer transistor 311, a reset transistor 312, an amplification transistor 313, a selection transistor 314, and floating diffusion 317.

The transfer control line 102 is connected to the gate electrode of the transfer transistor 111. The reset control line 115 is connected to the gate electrode of the reset transistor 112. The selection control line 116 is connected to the gate electrode of the selection transistor 114. The transfer control line 202 is connected to a gate electrode of the transfer transistor 211. The reset control line 215 is connected to a gate electrode of the reset transistor 212. The selection control line 216 is connected to a gate electrode of the selection transistor 214. The transfer control line 302 is connected to a gate electrode of the transfer transistor 311. The reset control line 315 is connected to a gate electrode of the reset transistor 312. A selection control line 316 is connected to a gate electrode of the selection transistor 314.

The selection transistors 114, 214, and 314 in the respective columns are connected to a pixel output reading line 603 in each column. The pixel output reading line 603 corresponds to the pixel output reading line 103 in FIG. 1. A constant current source 651 is connected to the pixel output reading line 603.

A connection relationship in each of the pixels 101, 201, and 301 is similar to the circuit in FIG. 2. In the pixel 101, a source follower including the amplification transistor 113 and the constant current source 651 amplifies a pixel signal, and the pixel signal of the pixel 101 is outputted to the pixel output reading line 603 by turning on the selection transistor 114. Similarly, in the pixel 201, a pixel signal of the pixel 201 is outputted to the pixel output reading line 603 by turning on the selection transistor 214. Similarly, in the pixel 301, a pixel signal of the pixel 301 is outputted to the pixel output reading line 603 by turning on the selection transistor 314.

In this embodiment, operation for averaging output of the pixels 101, 201, and 301 in rolling driving at the time of image pick-up of a moving image will be described. Output signals from the pixels 101, 201, and 301 can be averaged (added) on the pixel output reading line 603 by simultaneously turning on the selection transistors 114, 214, and 314. Differences among signal levels of the pixels 101, 201, and 301 are ideally small. However, for example, in a case where white flaw is generated in only a pixel among the three pixels, pixel output is averaged on a side on which an electric potential is high, and therefore the white flaw can be ignored at a practical usage. With this, the decision unit 108 in FIG. 1 can advantageously reduce false detection to improve detection accuracy.

As described above, the signal output circuit 106 supplies one of two or more values as the second voltage VTXL based on an average value (added value) of the output signals from the plurality of pixels 101, 201, and 301. In this embodiment, by averaging output of the pixels 101, 201, and 301 and reading the output, decision can be performed while reducing influence of a white flaw, and therefore it is possible to reduce false detection and reduce an image persistence damage.

Embodiment 7

Figure 12:
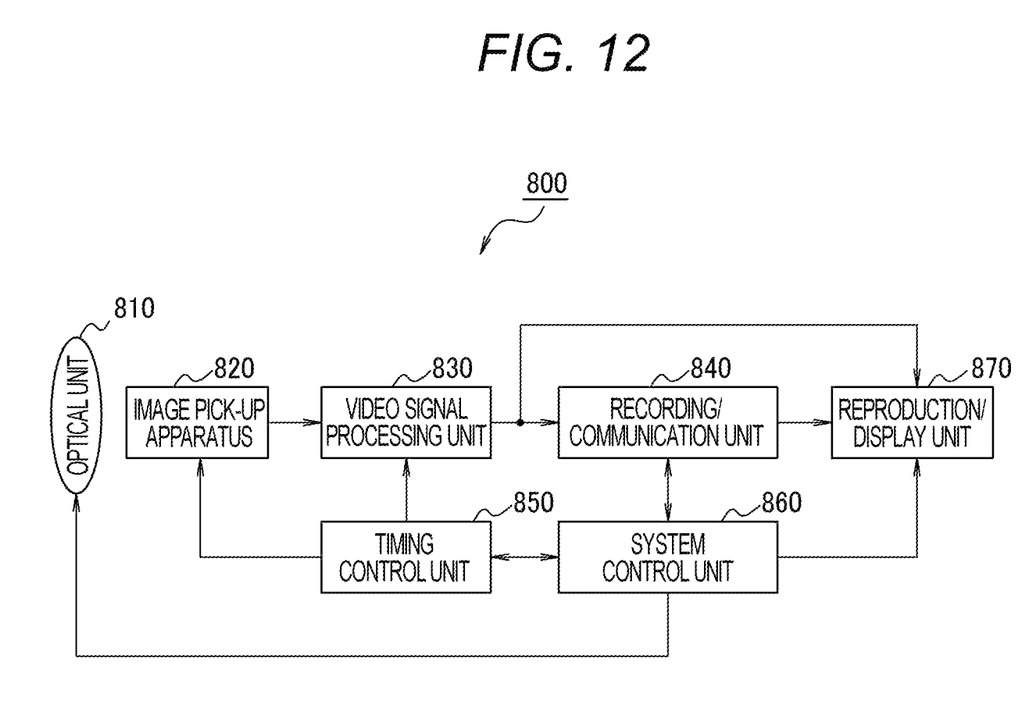
FIG. 12 is a diagram of a configuration example of an image pick-up system.

FIG. 12 is a diagram of a configuration example of an image pick-up system according to Embodiment 7 of the present disclosure. An image pick-up system 800 includes, for example, an optical unit 810, a solid-state image pick-up apparatus 820, a video signal processing unit 830, a recording/communication unit 840, a timing control unit 850, a system control unit 860, and a reproduction/display unit 870. As the solid-state image pick-up apparatus 820, the solid-state image pick-up apparatus according to Embodiments 1 to 6 is used.

The optical unit 810 which is an optical system such as a lens focuses light from an object in the plurality of pixels 101 dimensionally arrayed in the solid-state image pick-up apparatus 820, thereby forming an image of the object. The solid-state image pick-up apparatus 820 outputs a signal corresponding to the light focused in the plurality of pixels 101 at a timing based on a signal from the timing control unit 850. The signal outputted from the solid-state image pick-up apparatus 820 is inputted to the video signal processing unit 830 which is a video image signal processing unit, and the video signal processing unit 830 performs signal processing in accordance with a method defined by a program or the like. A signal obtained by the processing in the video signal processing unit 830 is outputted as image data to the recording/communication unit 840. The recording/communication unit 840 outputs a signal for forming an image to the reproduction/display unit 870 and reproduces or displays a moving image or a still image in the reproduction/display unit 870. The recording/communication unit 840 not only inputs the signal from the video signal processing unit 830 and communicates with the system control unit 860, but also performs operation for recording the signal for forming the image in a recording medium (not depicted).

The system control unit 860 collectively control operation of the image pick-up system and controls driving of the optical unit 810, the timing control unit 850, the recording/communication unit 840, and the reproduction/display unit 870. Further, the system control unit 860 includes, for example, a storage device (not depicted) which is a recording medium, and a program and the like which are needed to control the operation of the image pick-up system are recorded therein. Furthermore, the system control unit 860 supplies, for example, a signal for switching a driving mode in response to user operation into the image pick-up system. Specific examples thereof include a change in a row to be read and a row to be reset, a change in a field angle caused by electronic zooming, and shift of the field angle caused by electronic image stabilization. The timing control unit 850 controls driving timings of the solid-state image pick-up apparatus 820 and the video signal processing unit 830 based on control of the system control unit 860.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-130414, filed Jun. 25, 2014, which is hereby incorporated by reference herein in its entirety.

What is claimed is:

1. A solid-state image pick-up apparatus, comprising:
a pixel including a photoelectric conversion portion and a transfer transistor configured to transfer a charge in the photoelectric conversion portion; and
a signal output circuit configured to supply selectively a first voltage to turn on the transfer transistor and a second voltage to turn off the transfer transistor to the transfer transistor,
wherein the signal output circuit is configured to supply the second voltage having a voltage value selected from two or more different voltage values based on an output signal from the pixel,
the signal output circuit is configured to supply the second voltage having a first voltage value in a case where the output signal from the pixel is smaller than a threshold and supply the second voltage having a second voltage value different from the first voltage value in a case where the output signal from the pixel is larger than the threshold, and
the second voltage value is a voltage value between a voltage value of the first voltage and the first voltage value.

2. The solid-state image pick-up apparatus according to claim 1, wherein
the pixel is provided in a plurality, the plurality of pixels being provided in a matrix,
the signal output circuit is configured to supply the first voltage and second voltage in common to the transfer transistors of plurality of pixels in a single row among the pixels, and
in a case where none of the output signals from the pixels in a first row is larger than the threshold, the signal output circuit is configured to supply the second voltage having the first voltage value when a second row adjacent to the first row is selected, and
in a case where any of the output signals from the pixels in the first row is larger than the threshold, the signal output circuit is configured to supply the second voltage having the second voltage value when the second row is selected.

3. The solid-state image pick-up apparatus according to claim 1, wherein
the pixel is provided in a plurality, the plurality of pixels being provided in a matrix,
the signal output circuit is configured to supply the first voltage and second voltage in common to the transfer transistors of plurality of pixels in a single row among the pixels, and
in a case where none of the output signals from the pixels is larger than the threshold when reading a first frame, the signal output circuit is configured to supply the second voltage having the first voltage value to the pixels in all rows when reading a second frame subsequent to the first frame, and in a case where any of the output signals from the pixels is larger than the threshold when reading the first frame, the signal output circuit is configured to supply the second voltage having the second voltage value to the pixels in all the rows when reading the second frame.

4. The solid-state image pick-up apparatus according to claim 1, wherein the pixel is provided in a plurality, and the signal output circuit is configured to supply the second voltage having the voltage value selected from the two or more different voltage values based on an average value of the output signals from the plurality of pixels.

5. The solid-state image pick-up apparatus according to claim 1, wherein the pixel includes an amplification transistor configured to output a voltage corresponding to a charge transferred by the transfer transistor.

6. An image pick-up system, comprising:

the solid-state image pick-up apparatus according to claim 1; and an optical unit configured to focus light in the solid-state image pick-up apparatus.

7. The solid-state image pick-up apparatus according to claim 1, wherein the two or more different voltage values include at least a voltage value below zero.

8. A method of driving a solid-state image pick-up apparatus, the apparatus including a pixel including a photoelectric conversion portion and a transfer transistor configured to transfer a charge in the photoelectric conversion portion, the method comprising supplying selectively a first voltage to turn on the transfer transistor and a second voltage to turn off the transfer transistor to the transfer transistor, wherein the second voltage having a voltage value selected from two or more different voltage values is supplied based on an output signal from the pixel, the second voltage having a first voltage value is supplied in a case where the output signal from the pixel is smaller than a threshold, and the second voltage having a second voltage value that is different from the first voltage value is supplied in a case where the output signal from the pixel is larger than the threshold, and the second voltage value is a voltage value between a voltage value of the first voltage and the first voltage value.

9. The method of driving the solid-state image pick-up apparatus according to claim 8, wherein the pixel is provided in a plurality, the plurality of pixels being provided in a matrix, the first voltage and second voltage are supplied in common to the transfer transistors of plurality of pixels in a single row among the pixels, and in a case where none of the output signals from the pixels in a first row is larger than the threshold, the second voltage having the first voltage value is supplied when a second row adjacent to the first row is selected, and in a case where any of the output signals from the pixels in the first row is larger than the threshold, the second voltage having the second voltage value is supplied when the second row is selected.

10. The method of driving the solid-state image pick-up apparatus according to claim 8, wherein the pixel includes a plurality of pixels provided in a matrix, the first voltage and second voltage are supplied in common to the transfer transistors of the plurality of pixels in the same row, and in a case where none of the output signals from the pixel is larger than the threshold when reading a first frame, the second voltage having the first voltage value is supplied to the pixels in all rows when reading a second frame subsequent to the first frame, and in a case where any of the output signals from the pixel is larger than the threshold when reading the first frame, the second voltage having the second voltage value is supplied to the pixels in all the rows when reading the second frame.

11. The method of driving the solid-state image pick-up apparatus according to claim 8, wherein the solid-state image pick-up apparatus includes the pixel in a plurality, and the second voltage having the voltage value selected from the two or more different voltage values is supplied based on an average value of the output signals from the plurality of pixels.

12. The method of driving the solid-state image pick-up apparatus according to claim 8, wherein the pixel includes an amplification transistor configured to output a voltage corresponding to a charge transferred by the transfer transistor.

13. The method of driving the solid-state image pick-up apparatus according to claim 8, wherein the two or more different voltage values include at least a voltage value below zero.

14. A solid-state image pick-up apparatus, comprising:

a pixel including a photoelectric conversion portion and a transfer transistor configured to transfer a charge in the photoelectric conversion portion; and a signal output circuit configured to supply selectively a first voltage to turn on the transfer transistor and a second voltage to turn off the transfer transistor to the transfer transistor, wherein the signal output circuit is configured to supply the second voltage having a voltage value selected from two or more different voltage values based on an output signal from the pixel, the pixel is provided in a plurality, and the signal output circuit is configured to supply the second voltage having the voltage value selected from the two or more different voltage values based on an average value of the output signals from the plurality of pixels.

15. A solid-state image pick-up apparatus, comprising:

a pixel including a photoelectric conversion portion and a transfer transistor configured to transfer a charge in the photoelectric conversion portion; and a signal output circuit configured to supply selectively a first voltage to turn on the transfer transistor and a second voltage to turn off the transfer transistor to the transfer transistor, wherein the signal output circuit is configured to supply the second voltage having a voltage value selected from two or more different voltage values based on an output signal from the pixel, the pixel includes an amplification transistor configured to output a voltage corresponding to a charge transferred by the transfer transistor.

16. The solid-state image pick-up apparatus according to claim 15, wherein the signal output circuit is configured to supply the second voltage having a first voltage value in a case where the output signal from the pixel is smaller than a threshold and supply the second voltage having a second voltage value different from the first voltage value in a case where the output signal from the pixel is larger than the threshold, and the second voltage value is a voltage value between a voltage value of the first voltage and the first voltage value.

17. The solid-state image pick-up apparatus according to claim 15, wherein the pixel is provided in a plurality, the plurality of pixels being provided in a matrix, the signal output circuit is configured to supply the first voltage and second voltage in common to the transfer transistors of plurality of pixels in a single row among the pixels, and in a case where none of the output signals from the pixels in a first row is larger than the threshold, the signal output circuit is configured to supply the second voltage having the first voltage value when a second row adjacent to the first row is selected, and in a case where any of the output signals from the pixels in the first row is larger than the threshold, the signal output circuit is configured to supply the second voltage having the second voltage value when the second row is selected.

18. The solid-state image pick-up apparatus according to claim 15, wherein the pixel is provided in a plurality, the plurality of pixels being provided in a matrix, the signal output circuit is configured to supply the first voltage and second voltage in common to the transfer transistors of plurality of pixels in a single row among the pixels, and in a case where none of the output signals from the pixels is larger than the threshold when reading a first frame, the signal output circuit is configured to supply the second voltage having the first voltage value to the pixels in all rows when reading a second frame subsequent to the first frame, and in a case where any of the output signals from the pixels is larger than the threshold when reading the first frame, the signal output circuit is configured to supply the second voltage having the second voltage value to the pixels in all the rows when reading the second frame.

19. The solid-state image pick-up apparatus according to claim 15, wherein the pixel is provided in a plurality, and the signal output circuit is configured to supply the second voltage having the voltage value selected from the two or more different voltage values based on an average value of the output signals from the plurality of pixels.

20. An image pick-up apparatus comprising:

the solid-state image pick-up apparatus according to claim 15; and an optical unit configured to focus light in the solid-state image pick-up apparatus.

* * * * *